United States Patent [19]
Lozier

[11] 3,956,535
[45] May 11, 1976

[54] METAL PLATED OR PLATABLE ARTICLE

[75] Inventor: Gerald Scott Lozier, Princeton, N.J.

[73] Assignee: RCA Corporation, New York, N.Y.

[22] Filed: Jan. 30, 1974

[21] Appl. No.: 437,961

[52] U.S. Cl. .............................. 427/305; 427/306; 427/404; 427/419
[51] Int. Cl.² ........................................ C23C 3/02
[58] Field of Search ............... 117/71 R, 130 E, 72, 117/138.8 A, 47 A; 427/302, 305, 306, 404, 419

[56] References Cited
UNITED STATES PATENTS

| | | | |
|---|---|---|---|
| 3,119,709 | 1/1964 | Atkinson | 117/71 R |
| 3,167,491 | 1/1965 | Harrison et al. | 117/47 A |
| 3,379,556 | 4/1968 | Chieechi | 117/47 A |
| 3,501,332 | 3/1970 | Buckman | 117/71 R |

OTHER PUBLICATIONS

Grobin et al., *Metallization of Hydrophobic Polymers,* in IBM Technical Disclosure Bulletin, 15(3): p. 927, Aug. 1972.

Romankuv, L. T., *Activation of Polymer Surfaces for Electroless Metallization,* in IBM Technical Disclosure Bulletin 13(5) p. 1200, Oct. 1970.

*Primary Examiner*—Cameron K. Weiffenbach
*Assistant Examiner*—Charles R. Wolfe, Jr.
*Attorney, Agent, or Firm*—Glenn H. Bruestle; Arthur E. Wilfond; William S. Hill

[57] ABSTRACT

An article comprising a substrate body having a surface coated with a film of a resin having incorporated therein a hydrolyzed metal complex which has adsorbed thereon a metal or metal ion which is a catalyst for the deposition of a metal from an autocatalytic type metal plating bath. The article may also include a film of plated metal.

16 Claims, No Drawings

METAL PLATED OR PLATABLE ARTICLE

BACKGROUND OF THE INVENTION

Many metals can be deposited autocatalytically from baths which include a salt of the metal, a suitable reducing agent, a chelating or complexing agent and a pH-adjusting agent. The surface being plated must either be inherently catalytic for the autocatalytic deposition process, or it must be treated to render it catalytic. Glass and synthetic resins, for example, are not inherently catalytic. Usually, these and other non-catalytic surfaces can be rendered catalytic by, first, treating them with a sensitizing agent such as stannous chloride and then treating them with an activating agent such as palladium chloride. The stannous chloride treatment deposits a film of stannous ions on the surface and the stannous ions reduce some of the palladium salt to palladium. The metal being plated out builds up around palladium nuclei.

Although glass and most resins are readily wetted by solutions of the sensitizing agent and the activating agent, some plastics, such as polytetrafluoroethylene (Teflon), are so hydrophobic in nature that wetting is very non-uniform. This type of surface is difficult to plate autocatalytically. Also, many plastics which are not hydrophobic, still are difficult to plate with an adherent metal coating because they present a highly smooth surface to the metal film being deposited. For this reason, when the article being made requires that the metal coating be strongly adherent, as in making printed circuit boards, for example, the surface being plated must first be roughened to increase its porosity.

SUMMARY OF THE PRESENT INVENTION

One aspect of the present invention is an improved article which may be plated autocatalytically. The article comprises any substrate, whether or not it is normally difficult to plate electrolessly, having on a surface which it is desired to plate, a film of a resin having incorporated therein a hydrolyzed metal complex. The hydrolyzed metal complex has adsorbed thereon a metal which is a catalyst for autocatalytic deposition of the metal being plated. The usual stannous chloride sensitizing treatment is not required. Another aspect of the invention comprises the above described article with a coating of metal deposited thereon.

DESCRIPTION OF THE PREFERRED EMBODIMENTS

EXAMPLE 1

An example of a substrate which is normally difficult to plate electrolessly is a body made of polytetrafluoroethylene (Teflon) resin. To prepare this body for electroless metal deposition, the body is coated as follows.

A solution of an alkyl ortho titanate is prepared by dissolving 5% by volume of tetrakis 2-ethyl hexyl ortho titanate (Tyzor TOT, made and marketed by E. I. du Pont de Nemours and Co.), in Freon TF (E. I. du Pont de Nemours and Co.). To 150 cc of this solution is added 2 cc of a solution of an Indopol resin (Polybutene), (Amoco H-1900), which is prepared by dissolving 200 g of the resin in 250 g of Freon TF.

The resin solution is applied to the Teflon surface and the Freon TF is allowed to evaporate. The surface, which is now coated with the dried film, is dipped in a 0.1 molar NaOH solution for 30 seconds; this hydrolyzes the titanium compound to a titanium composition believed to comprise a complex mixture of oxides and hydroxides. The hydrolysis can also be carried out by treating the dried film in steam for 1 minute. After the hydrolysis treatment, the surface is rinsed in deionized water.

A metal which is catalytic to the electroless deposition of another metal which it is desired to plate out on the resin film is then adsorbed on the hydrolyzed titanium complex. For example, the surface may be treated with a dilute acidic solution of $PdCl_2$ to adsorb palladium ions. The palladium solution comprises 1 gram of $PdCl_2$ and 1 cc of concentrated HCl in a liter of water. This is followed by rinsing with deionized water to remove excess palladium ions.

Nickel may then be plated on the surface by immersing it in an aqueous solution having a composition as follows:

| | |
|---|---|
| $NiCl_2.6H_2O$ | 22 g/liter |
| $Na_4P_2O_7.10H_2O$ (chelating agent) | 50 g/liter |
| $NH_4OH$ (pH adjusting agent) (58% by wt. solution) | 20 cc/liter |
| $(CH_3)_2NHBH_3$ (dimethylamine borane) | 1.5 g/liter |

This bath is operated at room temperature.

The amine borane is a strong enough reducing agent to reduce the palladium ion to palladium metal and cause nickel deposition without any pre-treatment to convert the palladium ion to metallic palladium. However, if a conventional nickel-phosphorus bath in which the reducing agent is sodium hypophosphite is used to deposit the nickel, the surface must first be treated with a reducing agent to effect the ion-to-metal conversion. The pre-reduction can be carried out by treating the surface with formaldehyde, for example, or dipping the surface in the above nickel-boron bath.

EXAMPLE 2

A polypropylene resin substrate is first coated with a high molecular weight resin (Vistanex LM-MS, Humble Oil Co.) film containing an alkyl ortho titanate. A solution of the resin is prepared by dissolving 120 g of the resin in 200 g of Freon TF and 2 cc of this solution is dissolved in 150 cc of a 1% by volume solution of Tyzor TOT in Freon TF. The solution is applied to the substrate and the solvent is permitted to evaporate to form a solid film.

Palladium ion is caused to be adsorbed on the dried film by treating the film with a solution of palladium chloride as in Example 1 and, after rinsing, nickel may then be electrolessly deposited on the surface without pre-reduction of the palladium ion using the nickel-boron bath of Example 1.

Copper can also be electrolessly deposited on the activated surface without pre-reduction of the palladium ion using the following aqueous bath.

| | |
|---|---|
| $CuSO_4.5H_2O$ | 15 g/liter |
| PDTA $Na_4$ (40% solution) (PDTA $Na_4$ is the tetrasodium salt of propylenediamine tetraacetic acid) | 60 ml/liter |
| NaOH (pH adjusting agent) | 8 g/liter |
| $H_2CO$ (37%) | 40 ml/liter |
| $CH_3OH$ | 40 ml/liter |
| NaCN | 6 mg/liter |
| TMN (a non-ionic wetting agent | 3 mg/liter | made by Union Carbide Co.)

This bath operates at room temperature.

Nickel-phosphorus alloys can be electrolessly deposited on the surface of the film if the palladium ion is first reduced to palladium metal. The reduction can be carried out by treating the surface of the film with a reducing agent such as an amine borane or formaldehyde.

In this example the PDTANa$_4$ is a chelating agent.

EXAMPLE 3

Silver ion instead of palladium ion may be adsorbed on the resin films of either of the preceding examples or of any of the following examples, to serve as the activator or catalyst for electroless deposition. This is done by treating the resin film with a 0.1N solution of silver nitrate. The surface is then rinsed to remove excess silver nitrate solution. Without pre-reduction of the silver ion to silver metal, nickel can be electrolessly deposited on the catalytic surface using a nickel-boron bath as in Example 1 or a copper bath as in Example 2.

EXAMPLE 4

Instead of the tetrakis 2-ethyl hexyl ortho titanate of the previous examples, tetra butyl ortho titanate (partially polymerized) (Tyzor PB) is used as the hydrolyzable material. A solution is prepared which may comprise, for example,

| | |
|---|---|
| Tyzor PB | 4 ml |
| Freon TF | 100 ml |
| Benzene | 10 ml |
| Vistanex LM-MS (high molecular wt. polyisobutylene resin) (37.5% by wt. solution in Freon TF) | 3 ml |

This solution is used to deposit films on Teflon and Cronar (a polyester resin made and marketed by E. I. du Pont de Nemours) substrates and the resin film is activated either with silver nitrate or palladium chloride after hydrolysis of the Tyzor PB. Nickel or copper can be electrolessly deposited on the activated film as described above.

EXAMPLE 5

A resin film may be deposited on both Cronar and *Acrylite resin substrates from the following solution:

| | |
|---|---|
| Tyzor PB | 6 ml |
| Freon TF | 100 ml |
| Ganex 220 (alkyl vinylpyrolidone resin) 40 g in 200 ml of Freon TF | 10 ml |

*Acrylite is a polymethylmethacrylate resin marketed by Rohm and Haas.

The Tyzor PB is hydrolyzed in steam, and silver ion is then adsorbed on the film from a silver nitrate solution. Nickel or copper may then be electrolessly deposited on the activated film as described above or by using other conventional nickel or copper plating baths.

EXAMPLE 6

A resin film may be deposited on Teflon or Acrylite, for example, from the following solution which contains a different solvent from the previous examples.

| | |
|---|---|
| Tyzor PB | 3 ml |
| Vistanex LM-MS solution as in Example 4 | 3 ml |
| Methylene chloride | 100 ml |

Films deposited from this solution, hydrolyzed in steam and then treated with palladium chloride or silver nitrate may be electrolessly plated with nickel or copper as in the previous examples.

EXAMPLE 7

A resin film containing hydrolyzable titanium may be deposited on a substrate composed of either Cronar resin, polypropylene resin or Acrylite resin from a solution comprising:

| | |
|---|---|
| Tyzor PB | 3 ml |
| H-1900 (High molecular wt. polybutene resin of Amoco Co.) | 1 ml |
| Piccotex 120 (a polystyrene resin of Pennsylvania Industrial Chemical Corp.) | 3 ml |
| Freon TF | 100–500 ml |

The Tyzor PB is hydrolyzed in steam as in previous examples and the resin film may have silver ion or palladium ion adsorbed thereon. The activated film may have nickel or copper electrolessly deposited thereon.

EXAMPLE 8

The hydrolyzable substance can be something other than an alkyl ortho titanate. It can be TiCl$_4$ which is also hydrolyzable to form an oxide-hydroxide complex. In this example a solution of TiCl$_4$ may comprise:

| | |
|---|---|
| TiCl$_4$ | 5 ml |
| Methylene chloride | 100 ml |

This solution may be used in a resin film deposited from another solution such as the following:

| | |
|---|---|
| Gantrez B-201 (methylvinylether resin of GAF Co.) (10% by weight solution in Freon TF) | 20 ml |
| Freon TF | 75 ml |
| Solution of TiCl$_4$ in methylene chloride as above | 6 ml |

The resin film may be deposited on substrates such as Teflon, polypropylene and Acrylite. The TiCl$_4$ is then hydrolyzed with steam as was the Tyzor PB or TOT of previous examples. After the hyrolysis treatment, silver ion or palladium ion may be adsorbed on the film which may then be electrolessly plated with nickel or copper.

EXAMPLE 9

A resin film may be deposited on any substrate using the following composition:

| | |
|---|---|
| Vinyl maleic anhydride ester resin (AN8194 made by GAF Co.) (8% by wt. solution in Freon TF) | 40 ml |
| Freon TF | 75 ml |
| TiCl$_4$ | 1 ml |

After hydrolysis of the titanium compound with steam and adsorption of silver ion or palladium ion on the film, copper or nickel may be electrolessly deposited on the film as previously described.

EXAMPLE 10

The hydrolyzable substance may also be AlCl$_3$. A stock solution suitable for use in the present method is as follows:

| | |
|---|---|
| AlCl$_3$ | 10 g |
| Diethyl ether | 50 ml |

The solution may be diluted 10 to 1 with Freon TF when used. Any of various synthetic resins may be used as the film binder. One example is 3 ml of a 50% by wt. solution of polybutene resin in Freon TF, in 100 ml of the above solution. When the film produced from this composition is hydrolyzed and activated with palladium or silver, copper or nickel can be electrolessly deposited thereon.

In general, the present metal deposition process includes depositing a resin film on the object to be coated where the resin film contains a substance that is hydrolyzable to form an oxide-hydroxide complex. The resin serves as a matrix or binder and adherence agent. The film is deposited from a solution containing a volatile solvent which is capable of wetting the surface of the object being plated. The volatile solvent is evaporated. The process also includes hydrolyzing the hydrolyzable substance, rinsing and then adsorbing on the film, a metal which, when is reduced metal form, is capable of serving as a catalyst for the autocatalytic deposition of the desired metal. The desired metal is then deposited on the activated film using any conventional electroless plating bath. If the bath does not contain one of the stronger reducing agents such as an amine borane or formaldehyde, the adsorbed metal ion must be reduced to metal before treating with the electroless plating solution.

Although alkyl ortho titanates are preferred hydrolyzable substances to use in the present process, other hydrolyzable metal compounds such as titanium tetrachloride, zirconium tetrachloride and aluminum trichloride are also suitable. The hydrolyzable material must be soluble in the volatile solvent that is used. This may be accomplished by forming soluble complexes of the above as for example the AlCl$_3$-ether complex, noted above.

I claim:

1. An article of manufacture comprising a body having a surface comprising a resin, said resin having incorporated therein the hydrolysis product of a hydrolyzable metal selected from the group consisting of titanium, aluminum, and zirconium, said hydrolysis product having adsorbed thereon either a metal or metal ion, said adsorbed metal or metal ion being a catalyst for the autocatalytic deposition of a metal from a solution containing salt of nickel or copper, a reducing agent, a chelating agent and a pH-adjusting agent.

2. An article according to claim 1 in which said substrate body surface comprises a resin which is hydrophobic in nature.

3. An article according to claim 2 in which said hydrophobic resin is a polytetrafluoroethylene.

4. An article according to claim 1 in which said hydrolyzable metal is titanium.

5. An article according to claim 1 in which said hydrolyzable metal is aluminum.

6. An article according to claim 1 in which said adsorbed metal or metal ion is silver.

7. An article according to claim 1 in which said adsorbed metal or metal ion is palladium.

8. An article of manufacture comprising a substrate body having a surface comprising a resin, said resin having incorporated therein the hydrolysis product of a hydrolyzable metal, selected from the group consisting of titanium, aluminum and zirconium, said hydrolysis product having adsorbed thereon a metal which is a catalyst for the autocatalytic deposition of nickel or copper from a solution containing a salt of nickel or copper, a reducing agent, a chelating agent and a pH adjusting agent, and a film of the deposited metal adhered to the catalyzed surface.

9. An article according to claim 8 in which the deposited metal is copper.

10. An article according to claim 8 in which the deposited metal is nickel.

11. An article according to claim 8 in which said substrate body surface comprises a hydrophobic resin.

12. A method of electrolessly plating a non-metallic body with nickel or copper comprising:
    applying to said body a solution containing a resin binder, a metal compound that is hydrolyzable to form an oxide-hydroxide complex, and a volatile solvent for said resin binder and said metal compound capable of wetting the surface of said body,
    evaporating said solvent to form a film on said body,
    hydrolyzing said hydrolyzable compound,
    rinsing the film containing the hydrolyzed compound,
    applying to said film a solution of a metal compound wherein the metal is one which is catalytic to electroless deposition of nickel or copper, in order to adsorb metal ions from said compound on said film,
    rinsing the catalytic surface, and
    treating the catalytic surface with an electroless plating bath comprising a salt of nickel or copper, a reducing agent for said salt, a chelating agent and a pH adjusting agent.

13. A method according to claim 12 in which said body is composed of a hydrophobic synthetic resin.

14. A method according to claim 12 in which said hydrolyzable metal compound is a titanium compound.

15. A method according to claim 14 in which said metal ion which is adsorbed is silver or palladium.

16. A method according to claim 12 in which the resin film containing the hydrolyzed compound is treated with a solution of a reducing agent after the film has been treated with the catalytic metal and before treating the catalytic surface with the plating bath.

* * * * *